United States Patent [19]
Bennett et al.

[11] Patent Number: 5,663,902
[45] Date of Patent: Sep. 2, 1997

[54] SYSTEM AND METHOD FOR DISABLING STATIC CURRENT PATHS IN FUSE LOGIC

[75] Inventors: Michael J. Bennett, Timnath; Robert W. Proulx, Fort Collins, both of Colo.

[73] Assignee: Hewlett-Packard Company, Palo Alto, Calif.

[21] Appl. No.: 683,485

[22] Filed: Jul. 18, 1996

[51] Int. Cl.$^6$ .................................................. G11C 17/00
[52] U.S. Cl. .................................................. 365/96
[58] Field of Search .............................. 323/352, 353; 365/96, 100, 103, 225.7, 227

[56] References Cited

U.S. PATENT DOCUMENTS

| | | |
|---|---|---|
| 4,446,534 | 5/1984 | Smith .................................. 365/96 |
| 4,621,346 | 11/1986 | McAdams ............................ 365/227 |
| 5,140,554 | 8/1992 | Schreck et al. ..................... 365/201 |
| 5,212,413 | 5/1993 | Phelan et al. ....................... 327/537 |

*Primary Examiner*—Matthew V. Nguyen

[57] ABSTRACT

A programmable fuse circuit is provided with a disabling static current path. The fuse logic circuit includes a controllable switch, load device, and at least one fuse, all of which are connected in a series so as to share a static current path. The controllable switch is preferably a transistor and can be selectively controlled to enable or disable the current path of the programmable fuse circuit. Therefore, by providing the ability to disable the static current path of programmable fuse circuit without having to blow the fuse makes the programmable fuse circuit static current testable. Other applications for the programmable fuse circuit include, for instance, providing a serial number to integrated circuits.

20 Claims, 5 Drawing Sheets

SYSTEM AND METHOD FOR DISABLING STATIC CURRENT PATHS IN FUSE LOGIC

FIELD OF THE INVENTION

The present invention generally relates to programmable fuse circuits in an integrated circuit, and more particularly, to a programmable fuse circuit having a controllable switch for disabling a static current path through the fuse circuit.

BACKGROUND OF THE INVENTION

An integrated circuit is a microelectronic semiconductor device consisting of many interconnected transistors and other components. A single integrated circuit may comprise as few as one to two components, referred to as small-scaled integration (SSI), to as many as a thousand or more components, referred to as very-large-scaled integration (VLSI). Integrated circuits are typically fabricated on a wafer formed out of a suitable material such as silicon. On a single wafer, there may be 50 to 100 integrated circuits. Once fabricated, the wafer is cut into small rectangular dies comprising the individual integrated circuits. Each die is then packaged in a manner to protect the integrated circuit thereon.

For a variety of reasons, a certain percentage of the integrated circuits manufactured on a wafer will have manufacturing defects rendering the integrated circuits useless unless the circuits can be repaired. Such manufacturing defects may be attributed to material imperfections, technician error, or even the presence of a foreign object such as dust or dirt. Regardless of the cause of the defect, it is imperative that the defect be detected as early as possible in the final assembly process in order to preserve quality standards and to prevent any cost associated with the further processing of a defective product. Consequently, several tests are usually performed on an integrated circuit prior to the cutting of the wafer so that defective integrated circuits can be identified and repaired, if possible, before final assembly.

An important aspect of the testing performed on integrated circuits is that certain defects in the circuit are repairable if found prior to the packaging of the integrated circuit. For example, memory banks are typically designed to include redundant memory elements that may be mapped into and out of the circuit in order to replace defective memory elements. The defective memory elements are likewise mapped out of the memory bank so as to be rendered nonconsequential. The mapping in and mapping out of memory elements is typically done with a plurality of programmable fuse circuits that are configured to provide a control logic signal to a fuse logic circuit connected to the memory bank so as to program the operation of the memory bank by mapping in and mapping out elements. With reference to FIG. 1, a conventional programmable fuse circuit 12 utilized in programming memory is illustrated. In the fuse circuit 12, a fuse 14 is connected in series between ground (GND) and a load device 16. The load device 16 is also connected in series with a voltage supply (VDD). The resulting voltage divider is used to produce a logic output level that is dependent upon the state of the fuse. For instance, if the fuse is blown, the logical output level is high. Alternatively, if the fuse is not blown, the logical output level is low. Therefore, the programmable fuse circuit can be used to permanently program the operation of the memory bank.

One type of testing performed on integrated circuits during fabrication is functional logic testing. In functional logic testing, a stimulus in the form of a test pattern is applied to the input of an integrated circuit. The output of the integrated circuit is then observed and compared to a desired response pattern which would be expected if the integrated circuit is functioning properly. Preferably, numerous patterns are engineered and applied to the integrated circuit in order to thoroughly test the operation of the integrated circuit. Similarly, functional logic testing can be used to perform timing test by toggling the input signal to an integrated circuit in order to determine whether the integrated circuit meets the performance requirements for setup times, hold times, and propagation delays.

While functional logic testing is suitable for testing most integrated circuits, it is recognized that with complicated integrated circuits, particularly sub-circuits thereof, it may be difficult to stimulate the circuit with an input pattern and/or difficult to observe a response pattern which finds the fault. The sub-circuits may also be so deeply buried in multiple layers of surrounding circuitry that it is virtually impossible to physically access, much less apply the test pattern and/or observe an appropriate response pattern. Moreover, complicated integrated circuits such as application specific integrated circuits (ASIC's) are non-regular, and therefore, it is often impractical to engineer the large number of test patterns required to adequately test the ASIC in order to find all the combinations of faults and defects possible.

Another type of testing performed on integrated circuits is static current testing. In static current testing, the current drawn by an integrated circuit under test is measured when in the circuit is in a quiescent state. If a defect exists in the integrated circuit, a higher than normal static current (also referred to as quiescent current) flow is detected due to current paths caused by the defect. An advantage of this testing technique is that the current is observed through the power and ground connections of the integrated circuit which are accessible and easy to observe. In addition, this technique does not rely on the functional output of the integrated circuit or any sub-circuit thereof. Presently, static current testing is limited primarily to testing complimentary metal-oxide semiconductor (CMOS) circuits. This is because CMOS circuitry produces essentially no current while in a quiescent state. Therefore, if a current above a predetermined threshold is detected when the circuit is in a quiescent state, then a defect exists within the circuit.

However, a disadvantage of static current testing is that many types of integrated circuits are not characterized by having essentially no current flow while in a quiescent state as is the case with CMOS circuits. For example, the programmable fuse circuit 12 (FIG. 1) has a continuous static (i.e., quiescent) current path unless the fuse 14 is blown. Consequently, any integrated circuit incorporating the programmable fuse circuit 12 is not static current testable. This is a significant disadvantage since programmable fuse circuits like the one illustrated in FIG. 1 are commonly used in conjunction with fuse logic circuitry for permanently programming the operations of memory banks comprising random access memory (RAM), erasable programmable read only memory (EPROM), flash EPROM and numerous other suitable memory configurations, as discussed above.

In addition to the aforementioned needs in the industry, it has recently become desirable to have a unique machine readable serial number applied to integrated circuits for identification purposes. By providing a unique serial number on an integrated circuit, a variety of functions can be served. For instance, a data base of information regarding the origination, sale, specifications, etc. of an integrated circuit can be maintained. A plurality of programmable fuse circuits such as the one illustrated in FIG. 1 have been used to provide a binary serial number created by selectively blowing the fuses of respective fuse circuits. However, this method is undesirable because the programmable fuse circuits used for the serial number would be a constant power drain which is a critical design concern in most integrated circuit applications.

Thus, a heretofore need existed in the industry for a programmable fuse circuit with a static current path that can be selectively disabled.

SUMMARY OF THE INVENTION

The present invention overcomes the inadequacies and the deficiencies of the prior art as disclosed herein and as well known in the industry. The present invention provides for a programmable fuse circuit having a disabling static current path. The programmable fuse circuit can be employed in an integrated circuit to serve a variety of functional purposes such as allowing static current testing of a memory bank that employs programmable fuse circuits for programming fuse logic circuitry to map in or map out memory elements.

Briefly stated, the programmable fuse circuit of present invention provides for a controllable switch that can be selectively actuated to enable or disable a static current (i.e., quiescent current) path through the circuit. The controllable switch is preferably a transistor configured to receive an input signal that is either a logic high or logic low. Based upon the state of the input signal, the transistor will either enable or disable the current flow through the transistor, and thus, the current flow through the fuse logic circuit.

Accordingly, an integrated circuit that was previously not testable with static current techniques because of the static current of the programmable fuse circuits can now be tested with static current techniques by incorporating programmable fuse circuits in accordance with the principles of the present invention. By disabling the current path in the programmable fuse circuit via the controllable switch, the amount of static current in the integrated circuit can be observed in order to determine if a defect is present. This is particularly advantageous because the integrated circuits which were previously not static current testable may be static current tested, thereby providing more thorough testing of the integrated circuit. Further, certain defects can be corrected if identified such as done with mapping memory banks in order to replace defective memory elements with redundant memory elements as described hereinbefore. Therefore, the present invention not only increases quality but reduces production costs by minimizing the number of defective products that must be discarded.

Another function of a programmable fuse circuit in accordance with the principles of the present invention is in marking integrated circuits with serial numbers for identification purposes without having to continually power the programmable fuse circuits. As an example, the output of a plurality of programmable fuse circuits placed on an integrated circuit can be programmed to provide a unique binary serial number by selectively blowing the fuses. In this configuration, the present invention provides the advantage of having the controllable switches disabled until the serial number of the integrated circuits is to be read so that the programmable fuse circuits do not consume any power. When the serial number is to be read, the controllable switches are enabled so that current flows in the respective programmable fuse circuits that do not have a blown fuse, and the serial number can be read. Then the controllable switches can subsequently be disabled until it is once again desirable to read the serial number of the integrated circuit. This is particularly useful in the design of integrated circuits where power consumption is a critical design feature.

In a first embodiment the programmable fuse circuit comprises a load device and a fuse device connected in series. The load device is further connected to a power supply (VDD) and the fuse device is further connected in series to a controllable switch that is connected to ground. In this embodiment, the controllable switch is an n-channel metal oxide semiconductor field effect transistor (NMOS FET) configured as a pull-down device. The use of an NMOS FET is preferred in P-doped silicon substrate fabrication processes due to its increased charge mobility. The output of the programmable fuse circuit is taken at the connection between the load device and the fuse. Thus, when the fuse is blown or the NMOS FET disabled, the output is a logic high level. Otherwise, the output is a logic level low.

In an alternative configuration of the first embodiment, multiple fuses can be connected in series between the load device and the NMOS FET in order to provide for multiple outputs, as is often desired. In this alternative configuration, the outputs are typically taken at each connection between the adjacent fuses and the connection between the load device and the adjacent fuse. Typically, only one fuse may be blown in this series fuse circuit. As with the previous configuration, the logic level of the respective outputs depends upon the state of the fuses. Particularly, any fuse on the ground (GND) side of a blown fuse will have a low logic level output, while any fuses on the voltage supply (VDD) side of a blown fuse will have a high logic level output.

In a second embodiment, a programmable fuse circuit of the present invention comprises a load device and a fuse device connected in series as with the previous embodiment. However, with this embodiment, the load device is further connected in series to ground (GND) and the fuse device connected in series to a controllable switch that is connected to a power supply (VDD). In this embodiment, the controllable switch is a p-channel metal oxide semiconductor field effect transistor (PMOS FET) configured as a pull-up device. The PMOS FET is preferred in N-doped silicon substrate fabrication process or in a circuit that desires its output to be at a normally high logic level unless programmed. The output of the programmable fuse circuit is taken at a connection between the load device and the fuse. Opposite of the first embodiment, the output of the fuse logic circuit is a logic high unless the fuse is blown or the PMOS FET is disabled.

As with the first embodiment, the second embodiment can also be configured with multiple fuses in an alternative configuration whereby the fuses are connected in a series between the PMOS FET and the load device in order to provide multiple outputs. In this configuration, the outputs are taken at any of the connections between the adjacent fuses and the connection between the load device and the adjacent fuse.

An advantage of a programmable fuse circuit in accordance with the present invention is that it provides a programmable fuse circuit that is static current testable. Specifically, such a programmable fuse circuit would not prevent an integrated circuit from being testable with static current techniques. This allows for more thorough testing of the integrated circuits that incorporate programmable fuse circuits.

Another advantage of a programmable fuse circuit in accordance with the present invention is that it provides a programmable fuse circuit that does not consume any power when the output of the circuit is not needed.

Another advantage of a programmable fuse circuit in accordance with the present invention is that it provides a programmable fuse circuit that is simple to implement and efficient in operation.

Other features and advantages of the present invention will become apparent to one with ordinary skill in the art upon examination of the following drawings and detailed description. It is intended that all such additional features and advantages be included herein within the scope of the present invention, as defined by the appended claims.

BRIEF DESCRIPTION OF THE DRAWINGS

The present invention can be better understood with reference to the following drawings. The elements of the drawings are not necessarily to scale, emphasis instead being placed upon clearly illustrating the principles of the present invention. Furthermore, like reference numerals designate corresponding parts throughout the several views.

DETAILED DESCRIPTION OF THE PREFERRED EMBODIMENT

The following description is of the best contemplative mode of carrying out the present invention. The description is not to be taken in a limiting sense but is made merely for the purpose of describing the general principles of the invention. Therefore, the scope of the invention should be determined by referencing the appended claims.

I. Circuit Design

Figure 1:
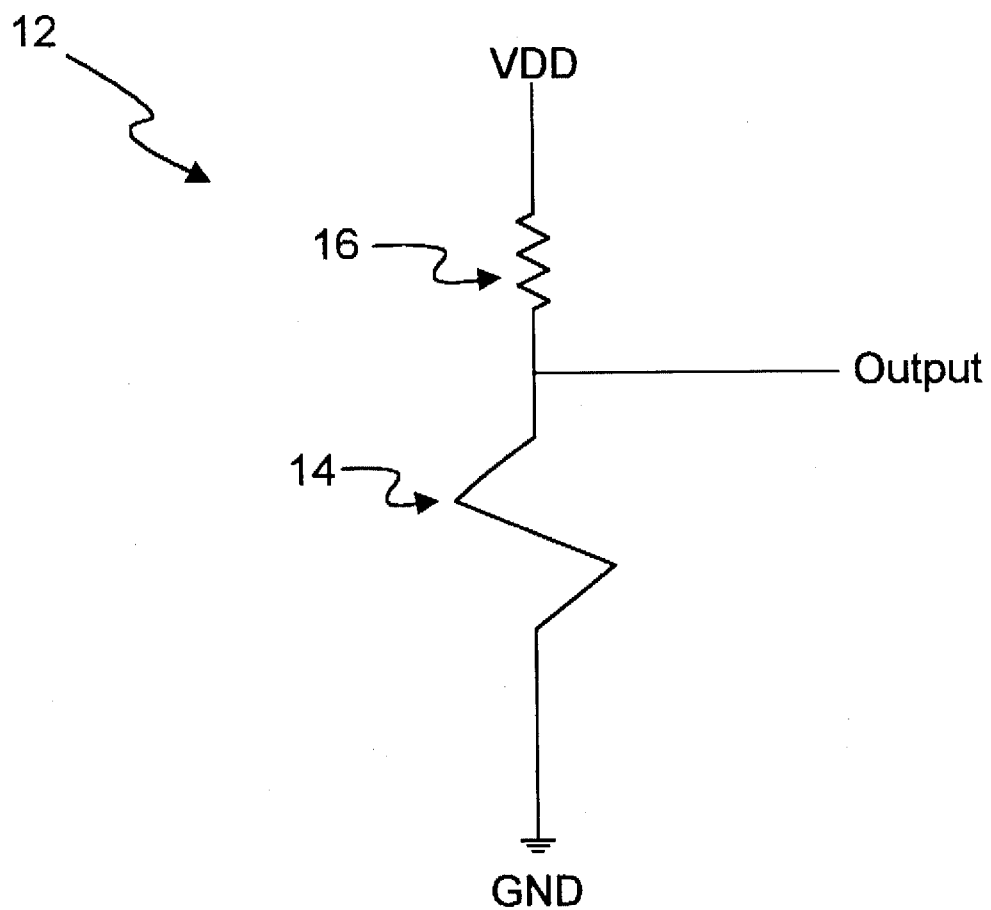
FIG. 1 is a schematic circuit diagram of a prior art programmable fuse circuit.
Figure 2:
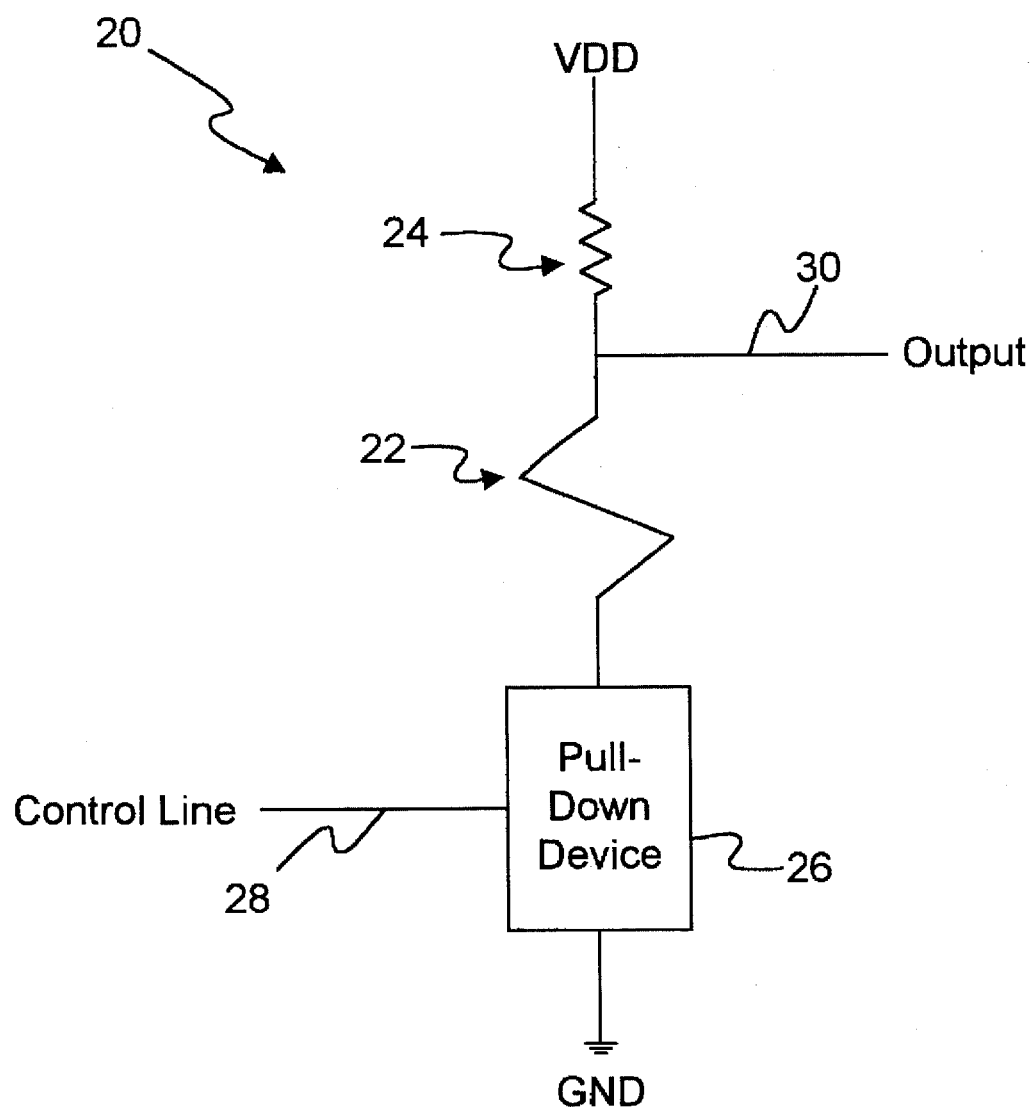
FIG. 2 is a schematic circuit diagram of a first embodiment of a programmable fuse circuit with a single output in accordance with the present invention.

Referring now to the drawings, FIG. 2 illustrates a first embodiment of a programmable fuse circuit 20 in accordance with the present invention. The programmable fuse circuit 20 includes a fuse device 22 and a load device 24 connected in series. The load device 24 is further connected in series to a power supply (VDD), and the fuse device 22 is further connected in series to a controllable switch 26 which is further connected to ground (GND). A control line 28 connected to the controllable switch 26 provides a control signal for enabling and disabling the controllable switch 26. The output of the programmable fuse circuit 20 is taken at an output line 30.

In this embodiment, the fuse device 22 preferably comprises a metal layer which is either conductive or not, depending on whether it has been blown. Alternatively, a polysilicon or silicide layer can also be used instead of a metal layer. The load device can be implemented by any resistive device, but is preferably implemented as either an N-doped WELL resistor or a p-channel metal-oxide semiconductor field effect transistor (PMOS FET). The controllable switch 26 is preferably an n-channel metal-oxide semiconductor field effect transistor (NMOS FET) configured as a pull-down device. However, it should be noted at this point that the controllable switch 26 can be implemented by any number of suitable devices configured as a controllable switch such as NPN and PNP bipolar junction transistors (BJT) devices, or junction field effect transistor (JFET) devices.

In the first embodiment, the particular configuration of an NMOS FET as a pull-down device for controllable switch 26 would be apparent to one of ordinary skill in the art. However, in general, the NMOS FET should preferably be configured such that its drain is connected to the fuse, its source is connected to ground (GND), and its gate connected to the control line 28. Therefore, if a control signal on the control line 28 is set to a logic high, then the controllable switch 26 is conductive. Conversely, if the control signal on control line 28 is set to a logic low, then the controllable switch 26 is nonconductive and the static current path through the programmable fuse circuit 20 is disabled. It should also be noted that if fuse device 22 is blown, the static current path of the programmable fuse circuit 20 is likewise disabled, regardless of the state of controllable switch 26.

Figure 3:
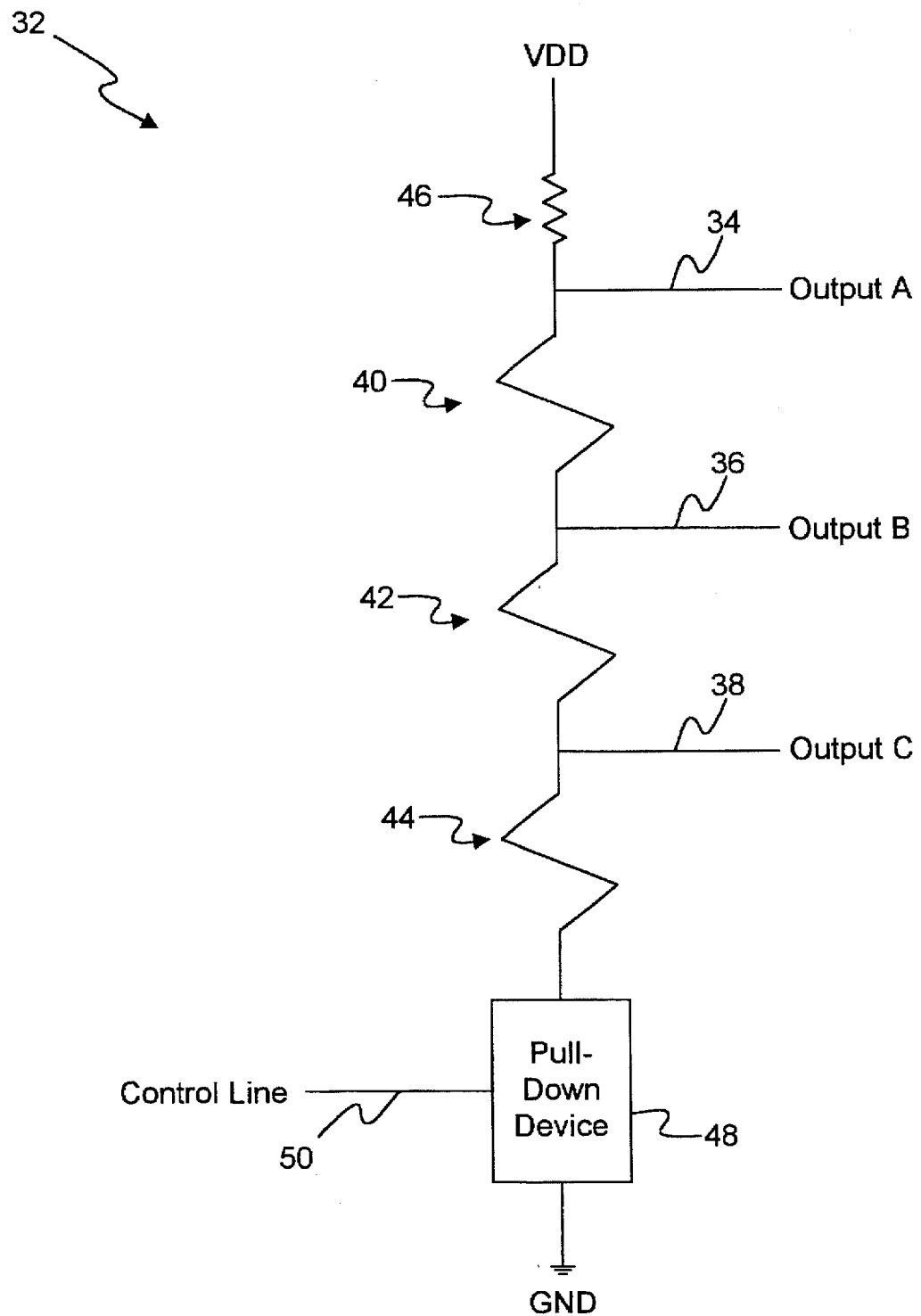
FIG. 3 is a schematic circuit diagram of an alternative configuration of the first embodiment with multiple outputs.

With reference to FIG. 3, an alternative configuration of the first embodiment is illustrated and denoted by reference numeral 32. The programmable fuse circuit 32 is configured substantially the same as that of the programmable fuse circuit 20 except that programmable fuse circuit 32 provides multiple outputs A, B, and C via respective output lines 34, 36, and 38. Corresponding with each of the output lines 34, 36, and 38 is a respective fuse 40, 42, and 44, wherein said fuses are connected in series. As shown in FIG. 3, a load device 46 is connected in series between the fuse 40 and voltage supply (VDD). In addition, a pull-down device 48 is connected in series between the fuse 44 and ground (GND). As with the first embodiment, the controllable switch 48 is preferably a NMOS FET configured as a pull-down device. Accordingly, the NMOS FET is configured such that its drain is connected to fuse 44, its source is connected to ground (GND), and its gate is connected to a control line 50, as would be apparent to one of ordinary skill in the art.

Thus, when a control signal on the control line 50 is a logic high, the controllable switch 48 is conductive. Alternatively, when the control signal on the control line 50 is a logic low, the controllable switch 48 is nonconductive, thereby disabling the static current path through the programmable fuse circuit 32. It is further noted that the outputs taken at respective output lines 34, 36, and 38, are dependent upon the state of fuses 40, 42, and 44, respectively, as described hereinbefore with regard to the programmable fuse circuit 20 (FIG. 2). Further, only one fuse device from the plurality of fuse devices 40, 42, and 44 will be blown in this case.

Figure 4:
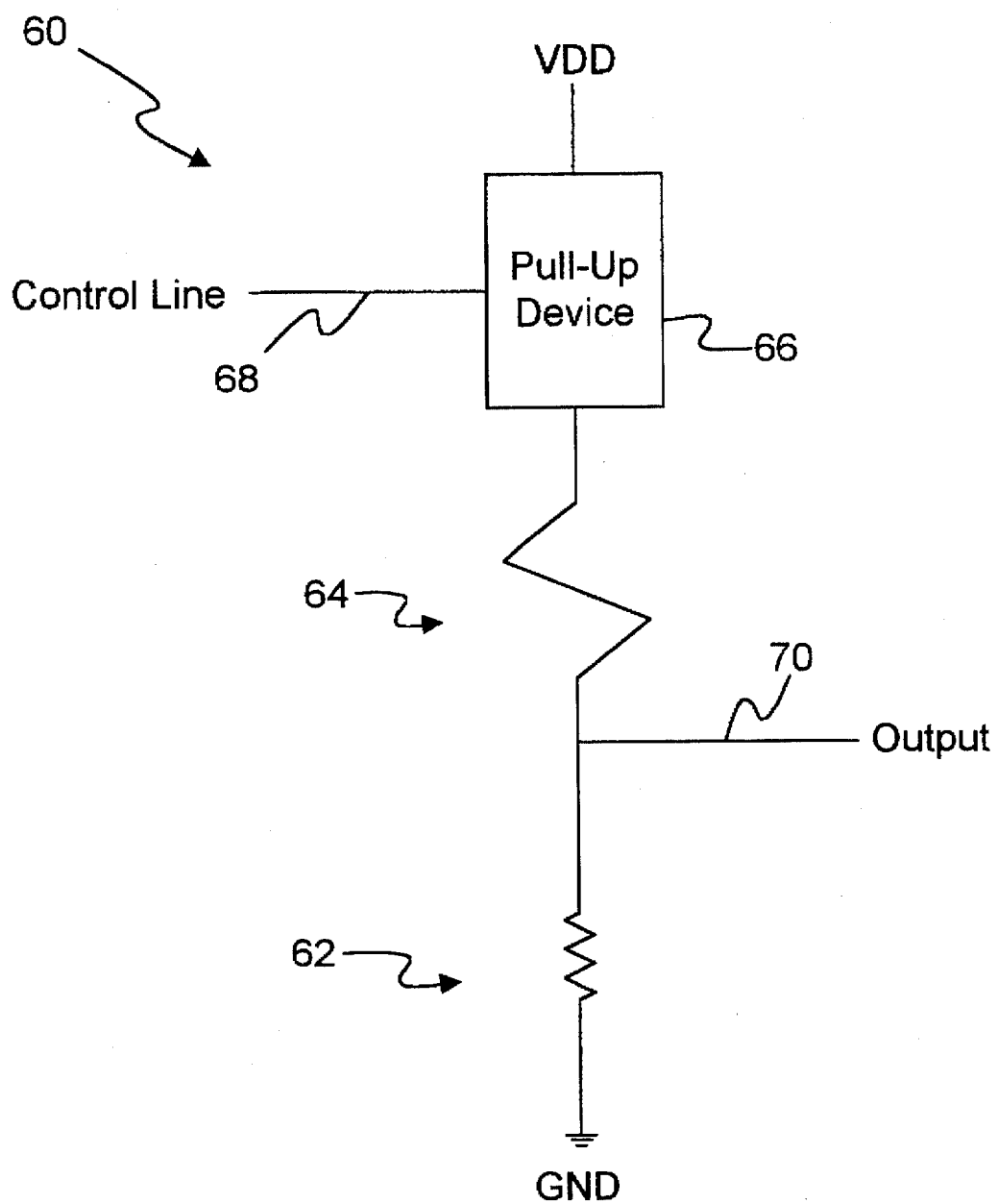
FIG. 4 is a schematic circuit diagram of a second embodiment of a programmable fuse circuit with a single output in accordance with the present invention.

In a second embodiment, as illustrated in FIG. 4, a programmable fuse circuit 60 comprises a load device 62 and fuse device 64 connected in series. The loaded device is further connected in series to ground (GND) and the fuse device 64 is further connected to a controllable switch 66 which is connected to a voltage supply (VDD). In this embodiment, the controllable switch 66 is a P-channel MOS FET (PMOS FET) configured as a pull-up device. However, it should be noted that the controllable switch 66 can be implemented by any number of other suitable devices such as NPN and PNP BJT devices, or JFET devices. Associated with the controllable switch 66 is a control line 68 for controlling the operation of the controllable switch 66 as described hereinbefore. The output of programmable fuse circuit 60 is taken on an output line 70 at the connection between the fuse device 64 and the load device 62.

Though the particular configuration of the PMOS FET for the controllable switch 66 is not illustrated in FIG. 4, the connections of the PMOS FET would generally include connecting the source of the PMOS FET to the power supply (VDD), the gate of the PMOS FET to the control line 68, and the drain of the PMOS FET to the fuse device 64. Thus, when a control signal on the control line 68 is a logic low, the PMOS FET is conductive so that the static current path is not disabled at the control switch 66. Alternatively, if the control signal on the control line 68 is a logic high, then the PMOS FET is nonconductive, disabling the static current path through the programmable fuse circuit 60.

Figure 5:
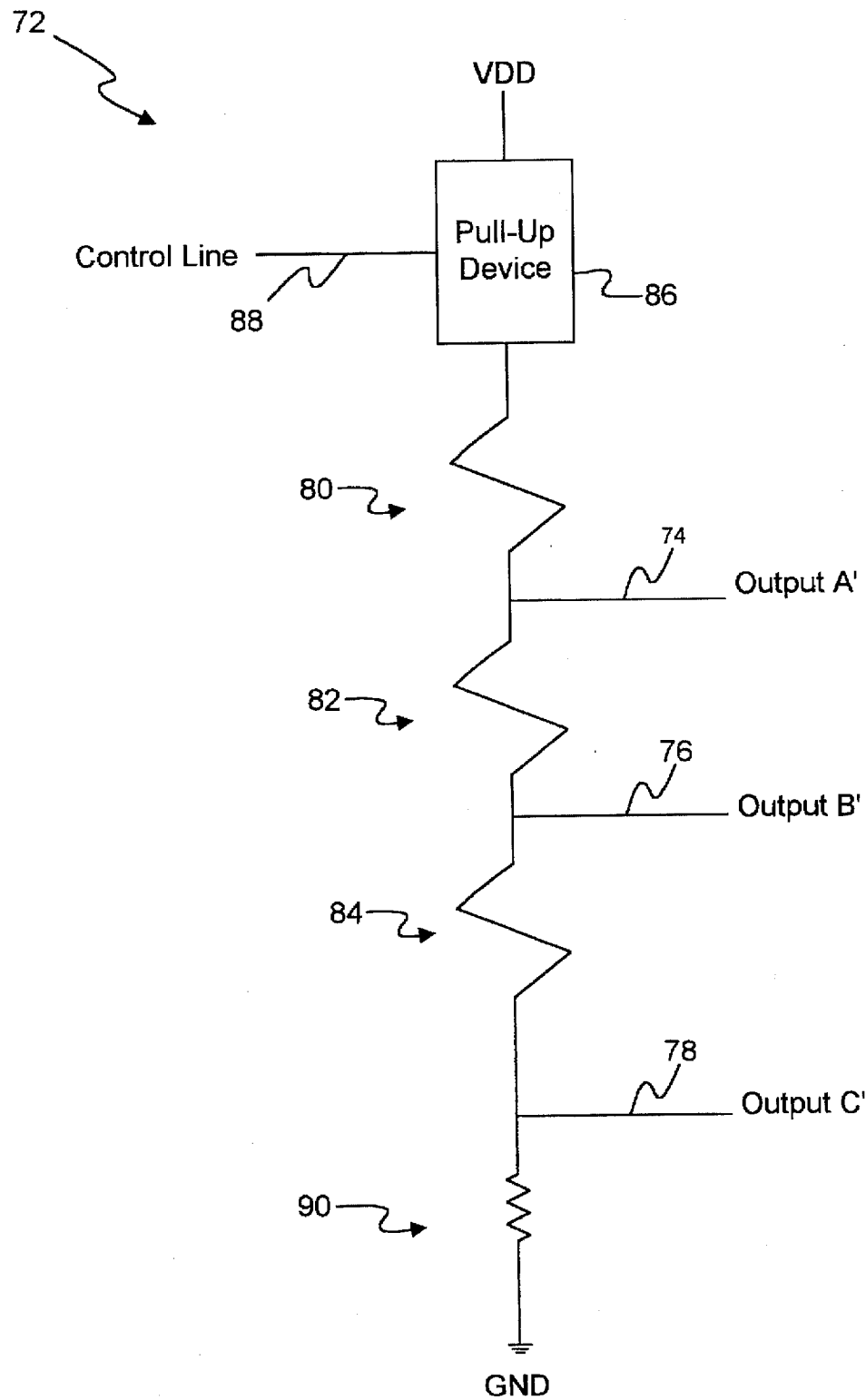
FIG. 5 is a schematic circuit diagram of an alternative configuration of the second embodiment with multiple outputs.

With reference to FIG. 5, an alternative configuration of the second embodiment is illustrated and denoted by reference numeral 72. The programmable fuse circuit 72 is configured much like programmable fuse circuit 60 though modified in order to provide multiple outputs A', B', and C' via the output lines 74, 76, and 78, respectively. Associated with each output line 74, 76, and 78 are respective fuses 80, 82, and 84 connected in series. Connected between fuse 80 and the voltage supply (VDD) is a controllable switch 86 configured as a pull-up device and preferably implemented via a PMOS FET. Associated with a controllable switch 86 is a control line 88 for controlling the operation of the controllable switch 86, as described hereinbefore. In addition, a load device 90 is connected between fuse 84 and ground (GND).

In accordance with the operation of a programmable fuse circuit with multiple outputs, the logic state of each output A', B', and C' at respective output lines 74, 76, and 78 depends on the state of fuses 80, 82, and 84, respectively, in addition to the state of controllable switch 86. As with the multiple output configuration of the first embodiment as illustrated in FIG. 3, only one fuse device from the plurality of fuse devices 80, 82, 84 will be blown in this case.

With particular reference to the operation of the controllable switch 86, when a control signal on the control line 88 is a logic low, the PMOS FET is conductive so that the static current path is not disabled at the control switch 86. Alternatively, if the control signal on the control line 88 is a logic high, then the PMOS FET is nonconductive, disabling the static current path through the programmable fuse circuit 72.

II. Circuit Operation

For purposes of brevity, the preferred operation and sequence of events corresponding with a programmable fuse circuit in accordance with the present invention and the associated methodology are described hereafter with reference to the programmable fuse circuit 20 (FIG. 2). It would be obvious to one of ordinary skill in the art how the programmable fuse circuits 32, 60, and 72 operate based upon the following discussion and the present disclosure taken as a whole.

With reference to FIG. 2, the operation of the programmable fuse circuit 20 is first discussed in the context of mapping memory elements out of and into a memory bank via fuse logic circuitry. By programming the fuse logic circuitry with the outputs from a plurality of programmable fuse circuits 20, the memory bank is static current testable because the static current paths through the programmable fuse circuits 20 can be disabled via the controllable switch 26. As mentioned above, this is desirable in order to achieve more thorough testing of the integrated circuit.

In order to perform static current testing, the signal on the control line 28 for each respective programmable fuse circuit 20 is set to a logic low. Preferably, the control lines 28 of the programmable fuse circuits 20 are connected to one another. This disables the static current path of each programmable fuse circuit 20 by rendering the controllable switch 26 nonconductive. Accordingly, static current test can be performed since substantially no static current can flow when the circuit is in a quiescent state other than that resulting from a defect.

Next, the operation of the programmable fuse circuit 20 is discussed in the context of providing a serial number on an integrated circuit for identifying the integrated circuit. Specifically, this is achieved by providing multiple programmable fuse circuits 20 on an integrated circuit (i.e., a chip) and programming these programmable fuse circuits with a unique binary serial number identifying that integrated circuit. A particular advantage of using the programmable fuse circuits 20 to provide a serial number is that the static current path of the programmable fuse circuits 20 can be disabled by the controllable switch 26 so that no power is consumed when the serial number is not needed. However, when it is desirable to read the serial number, the controllable switch can be enabled so as to be conductive, and thereby allow the serial number to be read.

The functionality described above with regard to the serial number is achieved by configuring a plurality of the programmable fuse circuits 20 so that their respective controllable switches 26 can be actuated substantially simultaneously and their respective outputs read in a manner to form a serial number that uniquely identifies that integrated circuit. In operation, a logic level low signal is placed on the control line 28 of each programmable fuse circuit 20 so that the static current path of each circuit 20 remains disabled and no direct current (DC) flows in the respective programmable fuse circuits 20. However, when the serial number is to be read, a logic high signal is placed on each control line 28 so as to enable the current path of each programmable fuse circuit 20 whose fuse 22 has not been blown. Accordingly, those fuse logic circuits which have not had their fuse blown will read a logic low at their output. Those programmable fuse circuits 20 which have had their fuse 22 blown will read a logic high at their output. Thus, the combination of the logic low and logic high outputs from the respective programmable fuse circuits 20 provides a unique binary serial number for identifying the integrated circuit.

In concluding the detailed description, it should be noted that it will be obvious to those skilled in the art that many variations and modifications may be made to the preferred embodiment without substantially departing from the principles of the invention. All such variations and modifications are intended to be included herein within the scope of the present invention, as set forth in the following claims. Further, in the claims hereafter, the structures, materials, acts, and equivalents of all means or step plus function elements are intended to include any structures, materials, or acts for performing the recited functions in combination with the other claimed elements as specifically claimed.

Wherefore, the following is claimed:

1. A programmable fuse circuit, comprising:
   a first power supply and a second power supply with a voltage differential therebetween;
   a load device connected to said first power supply and configured for dividing said voltage differential between said first and second power supplies in order to produce a logic output signal on an output line of said programmable fuse circuit;

a controllable switch connected to said second power supply, said controllable switch configured for selectively enabling and disabling a static current path through said programmable fuse circuit; and a fuse device connected in series between said load device and said controllable switch, a state of said fuse device determining a logic level of said logic output signal of said programmable fuse circuit;

whereby said current path through said controllable switch can be selectively enabled and disabled so as to prevent static current flow in said programmable fuse circuit.

2. The circuit of claim 1, wherein said controllable switch is a pull-down device.

3. The circuit of claim 1, wherein said controllable switch is a pull-up device.

4. The circuit of claim 1, further comprising a second fuse device connected in series with said fuse device, a state of said second fuse device determining a logic level of a second logic output signal of said programmable fuse circuit.

5. The circuit of claim 1, wherein said load device is a resistor.

6. The circuit of claim 1, wherein said fuse device comprises a conductive layer of metal.

7. The circuit of claim 1, wherein said first power supply is a voltage source and said second power supply is ground.

8. The circuit of claim 1, wherein said first power supply is ground and said second power supply is a voltage source.

9. The circuit of claim 1, wherein said logic output signal is sent to a fuse logic circuitry for programming a memory bank.

10. The circuit of claim 1, wherein said logic output signal is used for identification purposes.

11. A programmable fuse circuit disposed between a voltage supply and ground, said programmable fuse circuit including a load device operating as a voltage divider and a fuse device that can be blown in order to control a logic output level of said programmable fuse circuit, said programmable fuse circuit comprising:

a controllable switch device configured for selectively enabling and disabling a static current path through said programmable fuse circuit via a control signal;

whereby said static current path through said controllable switch can be selectively enabled and disabled by said control signal so as to prevent static current flow in said programmable fuse circuit.

12. The circuit of claim 11, wherein said controllable switch is connected in series between said voltage supply and said fuse device.

13. The circuit of claim 11, wherein said controllable switch is connected in series between said ground and said fuse device.

14. The circuit of claim 11, further comprising a second fuse device connected in series and configured to provide a second logic output.

15. The circuit of claim 12, wherein said controllable switch is a pull-up device.

16. The circuit of claim 13, wherein said controllable switch is a pull-down device.

17. A method for disabling a static current path in a programmable fuse circuit that is disposed between a voltage supply and ground, and includes a load device operating as a voltage divider and a fuse device that can be blown in order to control a logic output level of the programmable fuse circuit, said method comprising the step of:

controlling a switch device connected in series with said programmable fuse circuit and being configured for selectively enabling and disabling a static current path through said switch device in order to prevent static current flow in said programmable fuse circuit.

18. The method of claim 17, wherein said switch device is a pull-up device.

19. The method of claim 17, wherein said switch device is a pull-down device.

20. The method of claim 17, further comprising the step of reading said logic output level of said fuse circuit when said switch device is conductive.

* * * * *